(12) United States Patent
Fujii

(10) Patent No.: US 6,771,586 B2
(45) Date of Patent: Aug. 3, 2004

(54) SEMICONDUCTOR LASER ELEMENT, METHOD FOR MANUFACTURING THE SAME, AND OPTICAL PICKUP USING THE SAME

(75) Inventor: Yoshihisa Fujii, Ikoma-gun (JP)

(73) Assignee: Sharp Kabushiki Kaisha, Osaka (JP)

( * ) Notice: Subject to any disclaimer, the term of this patent is extended or adjusted under 35 U.S.C. 154(b) by 275 days.

(21) Appl. No.: 10/046,212

(22) Filed: Jan. 16, 2002

(65) Prior Publication Data

US 2002/0097662 A1 Jul. 25, 2002

(30) Foreign Application Priority Data

Jan. 19, 2001 (JP) ........................................ 2001-011643

(51) Int. Cl.[7] .................................................. G11B 7/00
(52) U.S. Cl. ........................ 369/121; 369/122; 369/116; 372/50
(58) Field of Search ................................ 369/121, 122, 369/116; 372/50, 45, 19, 20, 68, 107

(56) References Cited

U.S. PATENT DOCUMENTS 4,747,110 A * 5/1988 Takahashi et al. ............. 372/50
6,429,981 B2 * 8/2002 Ishii et al. ................... 359/813

FOREIGN PATENT DOCUMENTS

| JP | 3-030388 | 2/1991 |
| JP | 3-145779 | 6/1991 |
| JP | 6-104535 | 4/1994 |
| JP | 6-283812 | 10/1994 |
| JP | 10-233550 | 9/1998 |
| JP | 11-46039 | 2/1999 |
| JP | 11-112108 | 4/1999 |
| JP | 11-186656 | 7/1999 |
| JP | 2000-036639 | 2/2000 |
| JP | 2000-040854 | 2/2000 |
| JP | 2000-068589 | 3/2000 |
| JP | 2000-196203 | 7/2000 |
| JP | 2000-232255 | 8/2000 |
| JP | 2000-294878 | 10/2000 |
| JP | 2000-299529 | 10/2000 |
| JP | 2001-230495 | 8/2001 |

* cited by examiner

Primary Examiner—Muhammad Edun
(74) Attorney, Agent, or Firm—Morrison & Foerster LLP

(57) ABSTRACT

An object of the present invention is to stably manufacture a semiconductor laser element having a plurality of wavelengths without split of a wafer in a wafering step while preventing a tracking error due to the returning light of three beams in one semiconductor laser. The present invention provides a semiconductor laser element, which comprises a plurality of emitting regions formed on one substrate, each region having different wavelength, wherein at least one side portion of at least one emitting region is opposed to a part of the substrate.

6 Claims, 14 Drawing Sheets

SEMICONDUCTOR LASER ELEMENT, METHOD FOR MANUFACTURING THE SAME, AND OPTICAL PICKUP USING THE SAME

FIELD OF THE INVENTION

The present invention relates to a semiconductor laser element utilizing for an apparatus for recording and reproducing an optical information.

BACKGROUND OF THE INVENTION

In recent years, semiconductor laser elements are actively investigated and developed as a key device of a system for recording and reproducing an optical information.

In the course of such development, a digital versatile disc (DVD) has been made practicable, in response to requests for a higher recording density and a greater storage capacity than those of a compact disc (CD). In addition, for an apparatus for reproducing of this DVD, it is requested that the apparatus can also reproduce CD or read the data of CD from the necessity of an identical optical information system as well as of inheritance and utilization of the forepassed data.

A red semiconductor laser having a wavelength band of 635–650 nm is utilized in a pickup for reproducing DVD and, on the other hand, an infrared semiconductor laser having a wavelength band of 780 nm is utilized in a pickup for reproducing CD. Most CD (for example, music CD, or CD-ROM) can be reproduced or the data thereof can be read even by the semiconductor laser having a wavelength band of 635–650 nm since, in general, when a wavelength of the laser becomes short, then the diameter of the read out beam becomes small. But, for a compact disc-recordable (CD-R), reproduction or readout of the data is impossible by such the red semiconductor laser, since the reflectance of the recording disc thereof is low for the light having a wavelength of 635–650 nm.

In order to make it possible to reproduce all of DVD, CD and CD-R or to read the data thereof by one apparatus, a pickup containing two semiconductor lasers, which independently oscillates laser beams having different wavelengths, has been contrived and has been made practicable. However, a size of the pickup resulted in large since two semiconductor lasers are contained in one pickup, and a cost of the pickup is risen since the number of components is increased.

In order to solve such problems, a semiconductor laser in which two emitting regions, each of which emits the light having a different wavelength, are aligned in a transverse direction in one chip as shown in FIG. 13 has been made practicable in TECHNICAL REPORT OF IEICE. CPM99–84 (1999–09). Or, a semiconductor laser element in which two emitting regions, each emitting the light having a different wavelengths, are aligned in a transverse direction in one chip as shown in FIG. 14 has been developed in 47th APPLIED PHYSICS-RELATED ASSOCIATION CONFERENCE, Abstract (29a-N-4, 2000, 3).

In the case where the aforementioned semiconductor laser elements as shown in FIGS. 13 and 14 are utilized for an optical pickup, a system in which the laser beam is divided into three beams by grating, and an information recorded in the disc is read and a tracking position is detected by the divided beam is generally used in the infrared semiconductor laser. There are two side beams on both sides of a main beam from the semiconductor laser element in such three-beams system, and these beams reflected on the disc are returned to the semiconductor laser element. However, in the case where these side beams are returned to an end surface of a laser chip, a problem is arisen that an error signal is emerged in a tracking signal and, thereby, tracking is dysfunctioned, since these side beams are reflected on the end surface of the laser chip and are returned to an optical system again.

As a countermeasure for preventing a tracking error due to the light returning to the end surface of the laser chip as described above, for example, there is contrived in JPA 24030/1986 a method for thinning a thickness of a semiconductor laser element. However, since the distance between the main beam and the side beam is generally 50–80 $\mu$m, it is necessary that a thickness of the semiconductor laser element is not larger than the aforementoned distance in order to prevent the light from returning to the end surface of the laser chip by this method. In the case where such a thin semiconductor laser element is manufactured in this manner, there was a problem that the semiconductor laser element can not be stably manufactured since a wafer is frequently split off in a wafering step.

In addition, as another countermeasure for preventing the tracking error due to the light returning to the end surface of the laser chip as described above, for example, there is contrived in JPA 52737/1987 a method in which an emitting point of the laser chip is positioned at the center of the chip by forming a thick film layer on the emitting region of the semiconductor laser element, and this method is made practicable. However, in the case where this method is applied to a horizontal two-wavelengths laser, it becomes nessesarry to form the thick film layer also above the emitting region of the red semiconductor laser. As the result, there was a problem that the red semiconductor laser having the property or reliability at a practical level can not be obtained due to effects such as of a hot step in a thick film layer-forming process and of an increase in the thermal resistance by the thick film layer itself.

SUMMARY OF THE INVENTION

Figure 1:
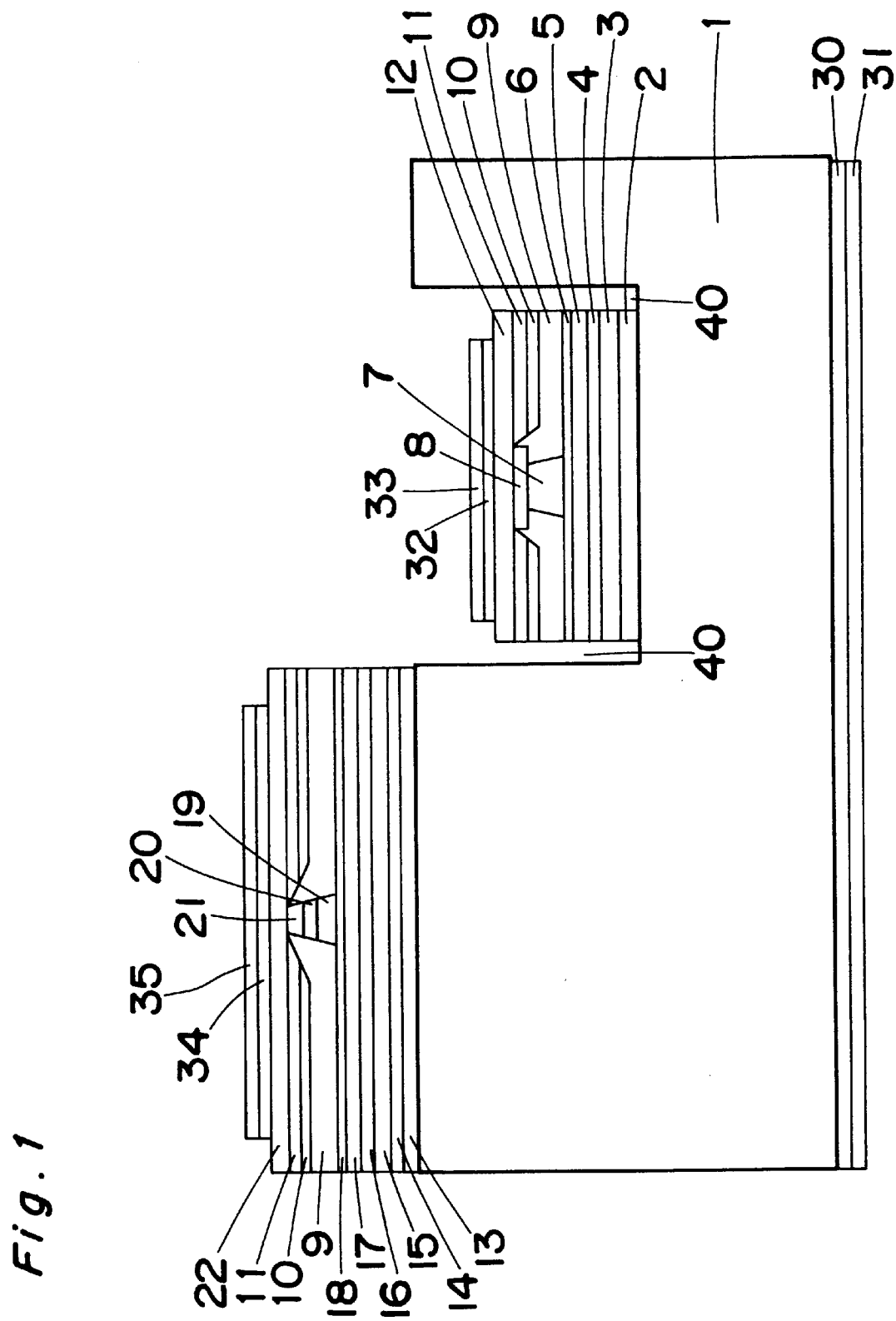
FIG. 1 is a structural view of the semiconductor laser element in accordance with Example 1 of the present invention.

In order to solve the problems as described above, the present invention features a semiconductor laser element in which a plurality of emitting regions, each region having a different wavelength, are formed on one substrate, wherein at least one side portion of at least one emitting region is opposed to a part of the substrate. The schematic representation of the semiconductor laser element of the present invention is shown in FIG. 1. According to the semiconductor laser element as shown in FIG. 1, it becomes possible that a thickness from a first emitting region to a bottom surface of the substrate is equal to or smaller than a distance between the main beam and the side beam of the emitting beam from the first emitting region while the thickness of the substrate is maintained such that a wafer is not frequently split off in a wafering step, by forming a semiconductor laser element in which a thickness from the first emitting region to the bottom surface of the surstrate is differenet from a thickness from the second emitting region to the bottom surface of the substrate. Thereby, it becomes possible that a tracking error due to the returning light of three beams is prevented in the semiconductor laser element having the first emitting region.

In addition, the present invention fetures the semiconductor laser element as described above, wherein both side portions of at least one emitting region are opposed to a part of the substrate. According to this semiconductor laser element, split of a wafer in a wafering step can be further reduced, since an area ratio in the wafer occupied by the portion of the semiconductor laser element having the first emitting region, said portion having a small thickness, can be reduced.

In addition, the present invention features to the semiconductor laser element as described above, wherein the side portion of at least one emitting region is separated from a part of the substrate. According to this semiconductor laser element, it becomes easy to electrically separate the semiconductor laser element having the first emitting region from the substrate or the semiconductor laser element having the second emitting region.

In addition, the present invention features the semiconductor laser element as described above, which comprises a thick film cap layer grown above the emitting region, wherein at least one side portion of the emitting region is opposed to a part of the substrate. According to this semiconductor laser element, it becomes possible to die-bond the semiconductor laser element on a submount at the cap layer side upon submounting such that the heights of a plurality of emitting regions of the semiconductor laser element are made iniform and, thereby, the semiconductor laser element having the improved heat-releasing property and the excellent thermal property and reliability can be provided.

In addition, the present invention features the semiconductor laser element as described above, wherein the substrate is an n-type GaAs substrate having a plane orientation of an off angle from the (100) surface direction toward the <011> direction in a range of 5–25°. According to this semiconductor laser element, the red semiconductor laser having the excellent property can be obtained.

In addition, the present invention features a process for manufacturing a semiconductor laser element, which comprises a step for forming a first emitting region at a bottom portion of a step-like substrate and a step for forming a second emitting region at a top portion of the step-like substrate. According to this process for manufacturing, the semiconductor laser element which can exert the excellent property as described above can be manufactured.

In addition, the present invention features process for manufacturing a semiconductor laser element as described above, which further comprises a step for thinning the substrate such that the thickness from the first emitting region to the bottom surface of the substrate becomes 70 µm or smaller and the thickness from the second emitting region to the bottom surface of the substrate becomes 90 µm or larger. According to this process for manufacturing, the tracking error due to the returning light of three beams can be prevented, and split of a wafer in a wafering step can be reduced.

Furthermore, the present invention features an optical pickup comprising the semiconductor laser element as described above, wherein the thickness from the emitting region, a side portion of which is opposed to a part of the substrate, to the bottom surface of the substrate is a thickness that the returning light of the side beams can not enter thereinto. According to this optical pickup, the tracking error is not caused since there is no reflection of the returning light of three beams from the semiconductor laser element on a laser beam-emitting end surface.

Moreover, in the present specification, a side portion referes to an end surface of the semiconductor laser element which is perpendicular to a laser beam-oscillating surface and is parallel to a lamination direction of the semiconductor laser element.

In addition, a step-like substrate referes to a substrate having a thickness varying in the lamination direction of the semiconductor laser element, and a top or bottom portion referes to a portion thereof having a larger or smaller thickness, respectively.

DETAILED DESCRIPTION OF THE PREFERRED EMBODIMENTS

According to the present invention, it becomes possible that a semiconductor laser element is formed, in which a distance from an emitting portion, a side portion of which is opposed to a part of the substrate, to the bottom surface of the substrate and a distance from another emitting region to the bottom surface of the substrate are different by opposing at least one side portion of at least one emitting region to a part of the substrate, in the semiconductor laser element in which a plurality of emitting regions, each having a different wavelength, are formed on one substrate.

According to this semiconductor laser element, it becomes possible that the effect of the returning light of three beams regarding the laser beam from the emitting region, the side portion of which is opposed to a part of the substrate, is diminished while the thickness of the substrate is maintained so as not to cause split of a wafer in a wafering step for forming the semiconductor laser element.

EXAMPLE

Examples of the present invention will be further illustrated below.

Example 1

FIG. 1 shows a structure of a semiconductor laser element of this Example. First, a partial step is formed on an n-type GaAs substrate 1 by etching. As a semiconductor laser element which is positioned at the bottom portion of the step-like substrate, an n-type GaAs buffer layer 2, an n-type $Al_{0.5}GaAs$ cladding layer 3, a non-doped AlGaAs MQW active layer 4, a p-type $Al_{0.5}GaAs$ first cladding layer 5, and a p-type GaAs etching stop layer 6 are successively provided on the n-type GaAs substrate 1. Then, thereon are provided a ridge stripe composed of a p-type $Al_{0.5}GaAs$ second cladding layer 7 and a p-type GaAs cap layer 8, wherein a current constriction layer of n-type $Al_{0.7}GaAs$ 9, n-type GaAs 10 and p-type GaAs 11 is buried in the side surfaces of the ridge stripe. A p-type GaAs contact layer 12 is provided on the ridge stripe and the current constriction layer as described above.

In addition, as the semiconductor laser element which is positioned at the top portion of the step-like substrate, an n-type GaAs buffer layer 13, an n-type GaInP buffer layer 14, an n-type $(Al_{0.72}Ga)InP$ cladding layer 15, a non-doped GaInP/AlGaInP MQW active layer 16, a p-type $(Al_{0.72}Ga)InP$ first cladding layer 17, and a non-doped GaInP etching stop layer 18, and the ridge stripe composed of a p-type $(Al_{0.72}Ga)InP$ second cladding layer 19, a p-type GaInP intermediate layer 20 and a p-type GaAs cap layer 21 thereon are provided, wherein a current constriction layer of n-type $Al_{0.7}GaAs$ 9, n-type GaAs 10 and p-type GaAs 11 is buried in the side surfaces of the ridge stripe. In addition, a p-type GaAs contact layer 22 is provided on the ridge stripe and the current constriction layer as described above.

Then, as an n-type electrode for both semiconductor laser elements, an AnGe/Ni electrode 30 and an Mo/Au electrode 31 are provided on a side of the n-type GaAs substrate 1. Moreover, as a p-type electrode for each semiconductor laser element, an Au/AuZn electrode 32 and an Mo/Au electrode 33 are provided on the p-type GaAs contact layer 12 of the semiconductor laser element formed at the bottom portion of the step-like substrate, and an Au/AuZn electrode 34 and an Mo/Au electrode 35 are provided on the p-type GaAs contact layer 22 of the semiconductor laser element formed at the top portion of the step-like substrate.

In addition, grooves for electrically separating the semiconductor laser element from the substrate 40 are provided on both side portions of the semiconductor laser element formed at the bottom portion of the substrate, where the semiconductor laser element is opposed to the substrate.

Such the semiconductor laser element can be fabricated as follows.

Figure 2:
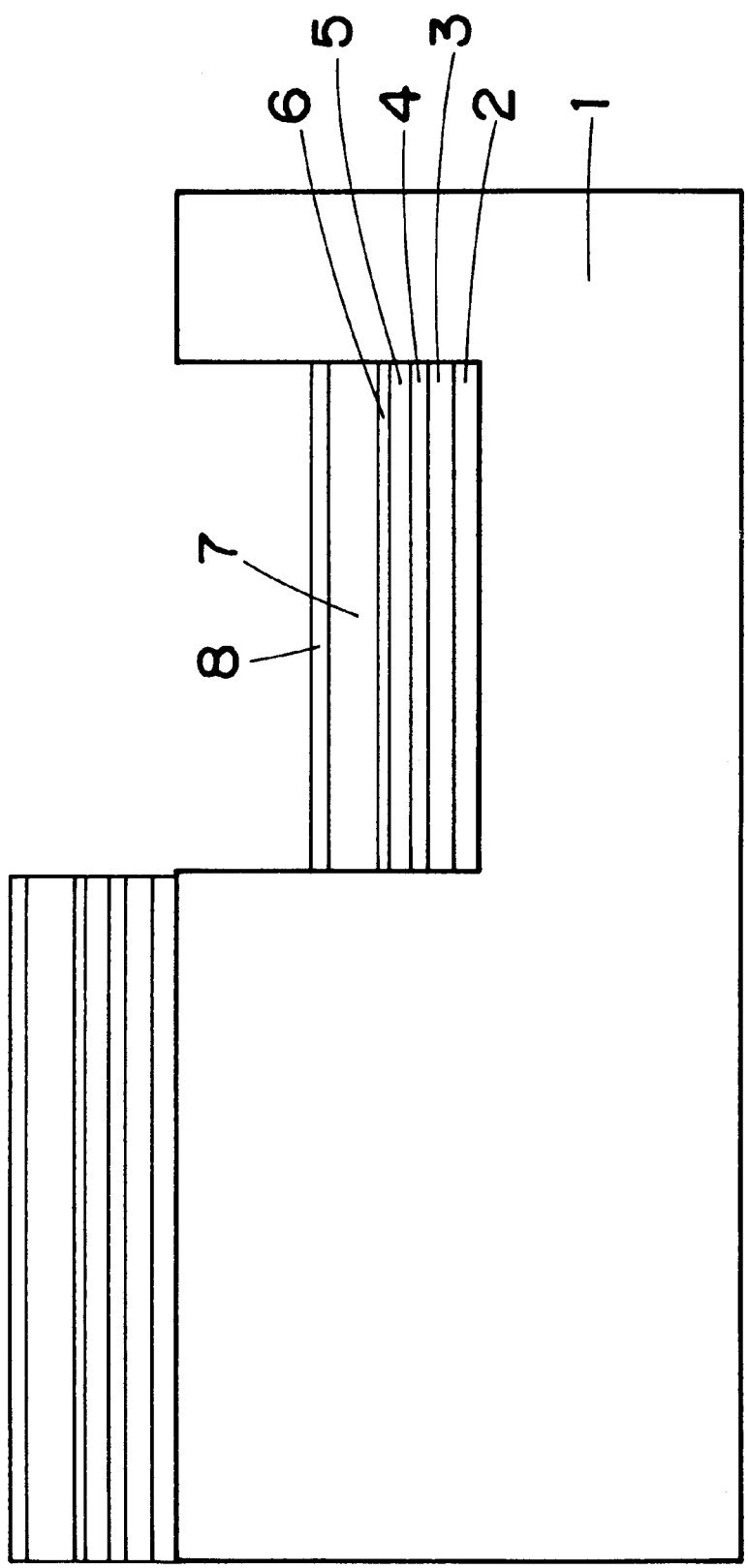
FIGS. 2–11 are structural views for illustrating one step of the process for manufacturing the semiconductor laser element in accordance with Example 1 of the present invention.

First, a partial step is formed on the n-type GaAs substrate 1 as shown in FIG. 2. As the n-type GaAs substrate, a substrate having an off angle from the (100) surface direction toward the <011> direction of 15° was utilized. Moreover, the substrate utilized for the semiconductor laser element of the present invention preferably includes, but not limited to, an n-type GaAs substrate, which as a plane orientation as an off angle from the (100) surface direction toward the <011> direction in a range of 2–30°, preferably 5–25°, and more preferably 10–20°.

For forming a step, an $SiO_2$ film is formed on the n-type GaAs substrate 1 by a plasma CVD method, and an opening region of the $SiO_2$ film having a 100 µm width is formed by photolithography and etching, followed by removal of the n-type GaAs substrate 1 at the opening region of the $SiO_2$ film by a thickness of 40 µm by a dry-etching method. In dry-etching, an ICP (Inductive Coupled Plasma) method with an $SiCl_4$ gas and an Ar gas is used.

After the step is formed by dry-etching, an $SiO_2$ mask is removed by etching, and then an emitting region of the infrared semiconductor laser element is formed on the n-type GaAs substrate 1 by an MOCVD method. Specifically, an n-type GaAs buffer layer 2 having a thickness of 0.5 µm, an n-type $Al_{0.5}GaAs$ cladding layer 3 having a thickness of 1.6 µm, and $Al_{0.27}GaAs$ having a thickness of 60 Å+($Al_{0.128}GaAs$ having a thickness of 100 Å×8 and $Al_{0.35}GaAs$ having a thickness of 50 Å×7)+$Al_{0.27}GaAs$ having a thickness of 60 Å as a non-doped MQW active layer 4, a p-type $Al_{0.5}GaAs$ first cladding layer 5, a p-type GaAs etching stop layer 6 having a thickness of 28 Å, a p-type $Al_{0.5}GaAs$ second cladding layer 7 having a thickness of 1.23 µm, and a p-type GaAs cap layer 8 having a thickness of 0.75 µm are successively grown at a growth temperature of 685–750° C. by the MOCVD method.

Figure 3:
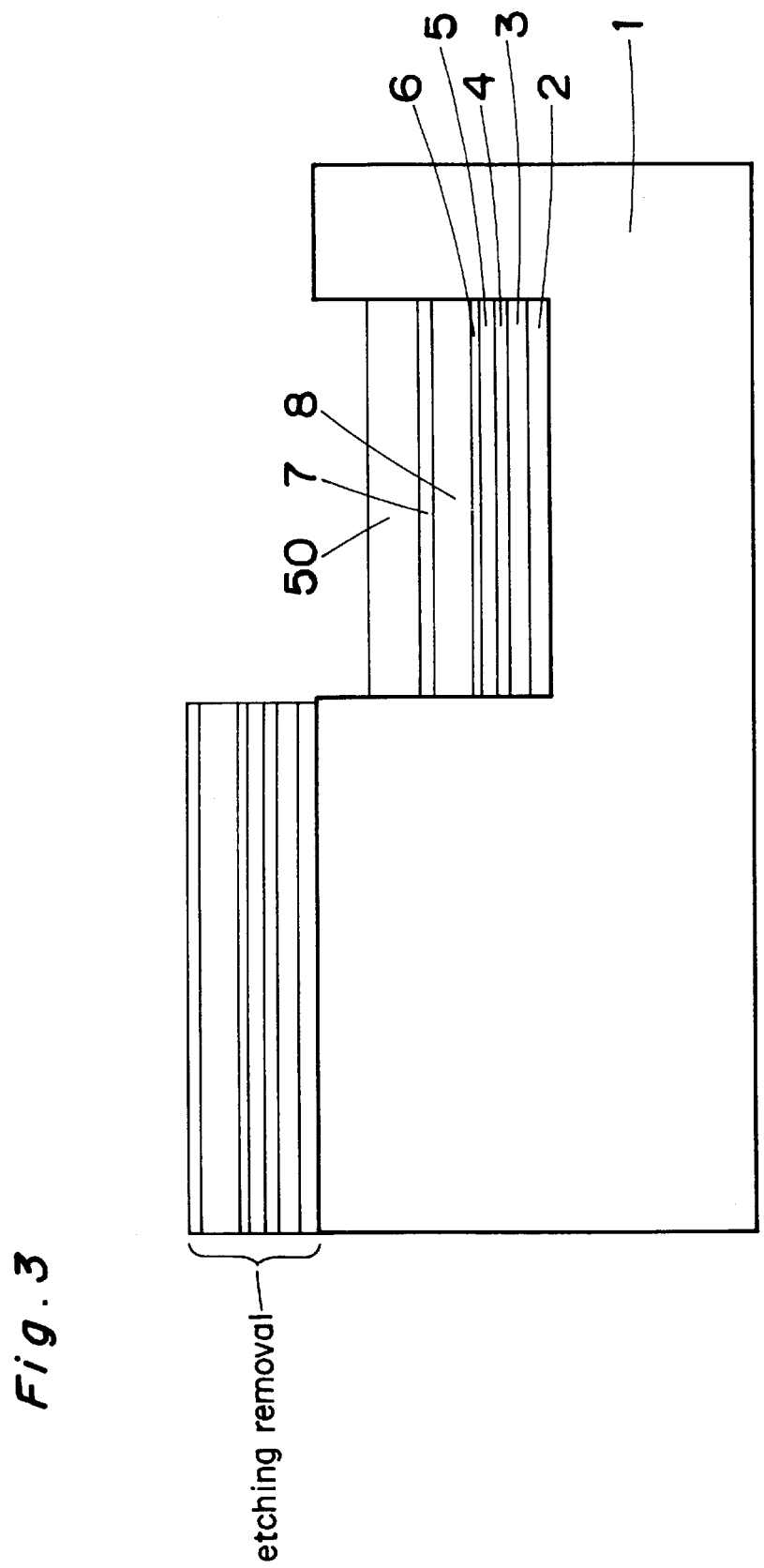
Figure 4:
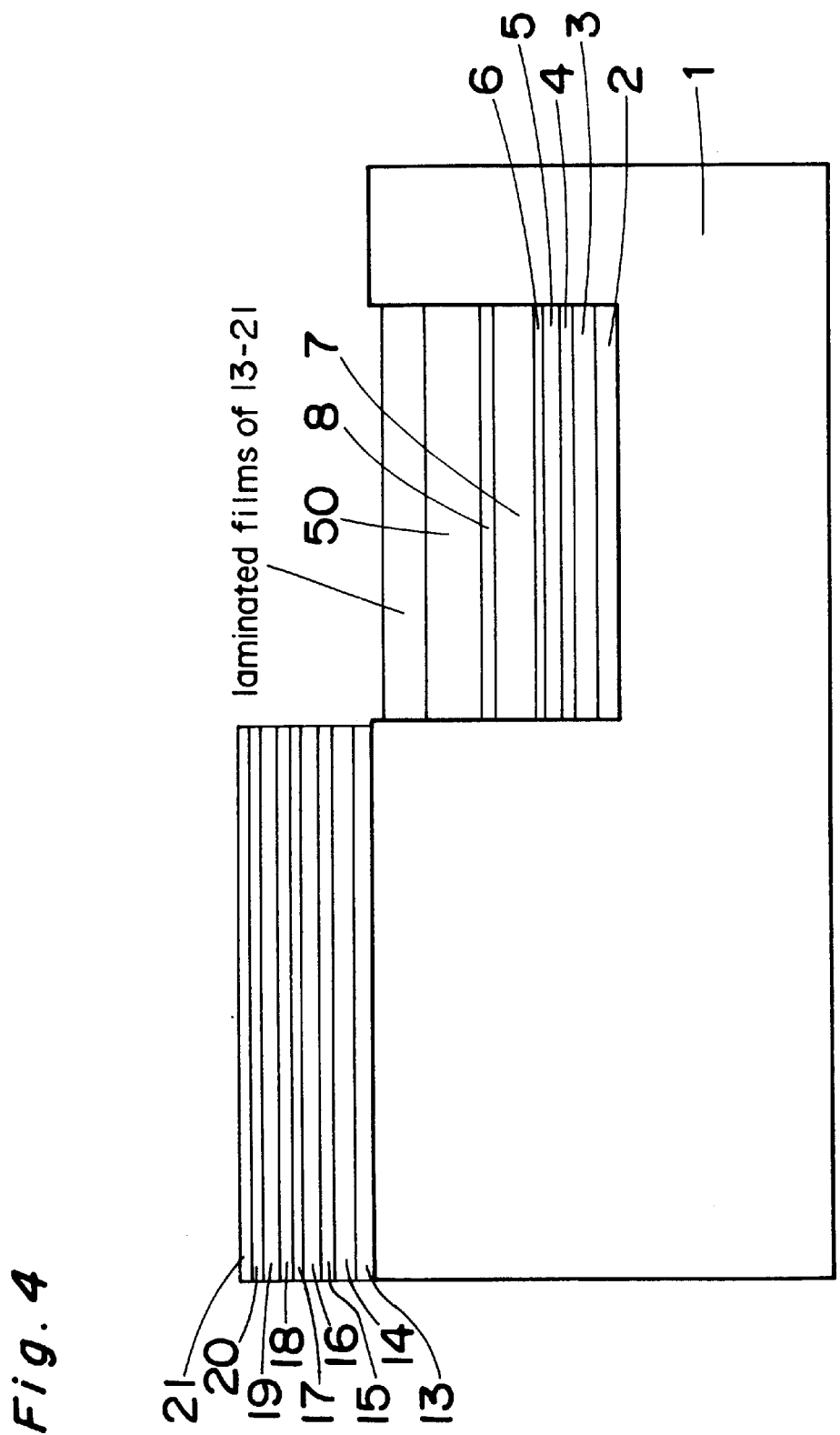

Then, as shown in FIG. 3, the $SiO_2$ film 50 is formed by a plasma CVD method, and then the $SiO_2$ film at the top portion of the step-like substrate is removed by etching while leaving only $SiO_2$ film on the emitting region of the infrared semiconductor laser formed at the bottom portion of the step-like substrate. Then, the emitting region of the infrared semiconductor laser formed at the top portion of the step-like substrate by the MOCVD method is removed by a dry-etching method.

Then, the emitting region of the red semiconductor laser element is formed by an MBE method. Specifically, a sulfuric acid treatment is conducted as a pre-growth treatment and, then, an n-type GaAs buffer layer 13 having a thickness of 0.25 µm, an n-type GaInP buffer layer 14 having a thickness of 0.25 µm, an n-type $(Al_{0.72}Ga)InP$ cladding layer 15 having a thickness of 1.2 µm, and $(Al_{0.5}Ga)InP$ having a thickness of 500 Å+(InGaP having a thickness of 50 Å×4 and $(Al_{0.5}Ga)InP$ having a thickness of 50 Å×3)+$(Al_{05}Ga)InP$ having a thickness of 500 Å as a non-doped MQW active layer 16, a p-type $(Al_{0.72}Ga)InP$ first cladding layer 17 having a thickness of 0.17 µm, a non-doped GaInP etching stop layer 18 having a thickness of 80 Å, a p-type $(Al_{0.72}Ga)InP$ second cladding layer 19 having a thickness of 1.03 µm, a p-type GaInP intermediate layer 20, and a p-type GaAs cap layer 21 are successively grown at a growth temperature of 480–490° C.

Figure 5:
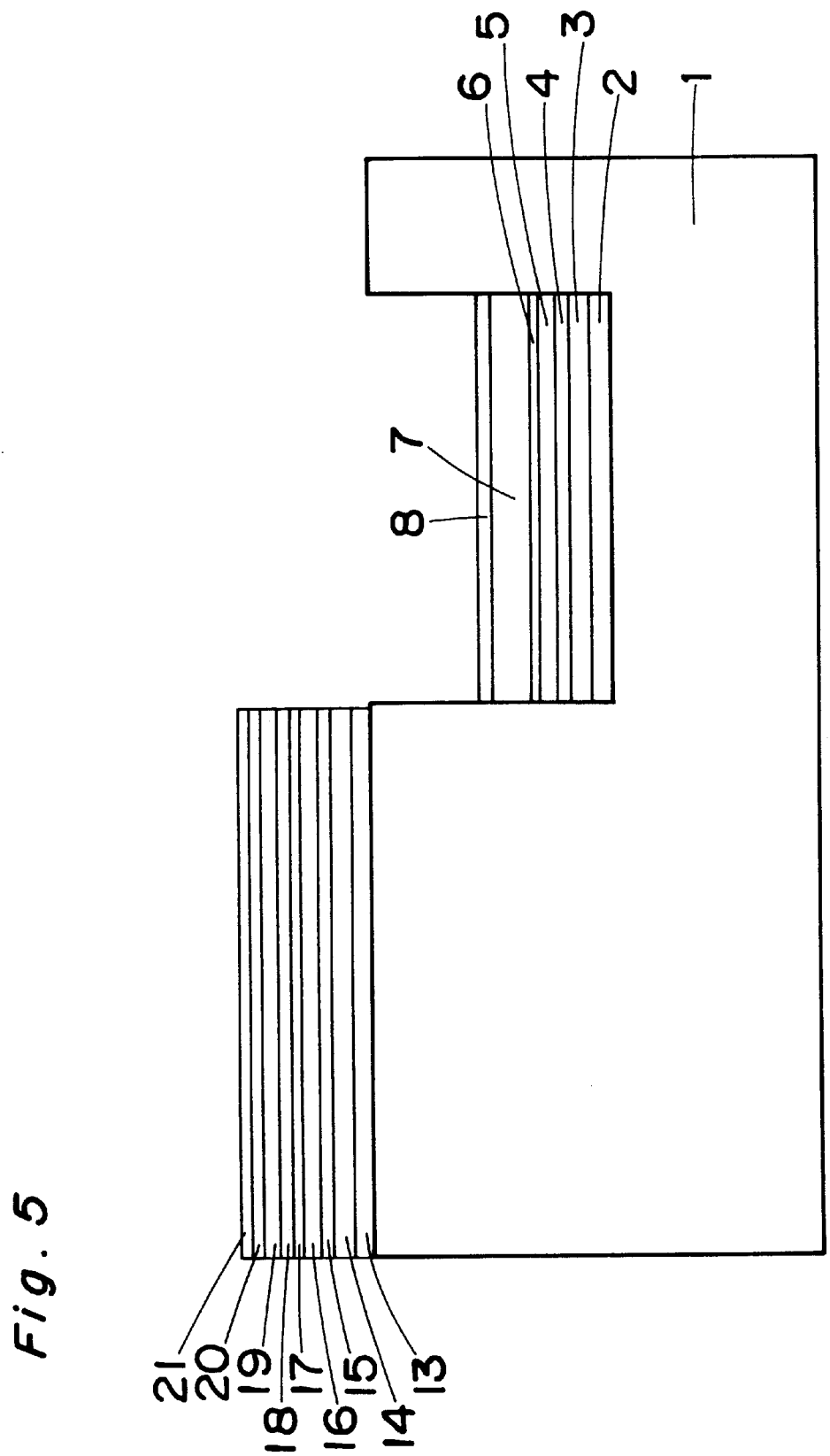

Then, the $SiO_2$ film 50 on the infrared semiconductor laser formed at the bottom portion of the step-like substrate and laminated films 13–21 formed thereon are removed by lifting off the $SiO_2$ film with hydrofluoric acid-etching (FIG. 5).

Figure 6:
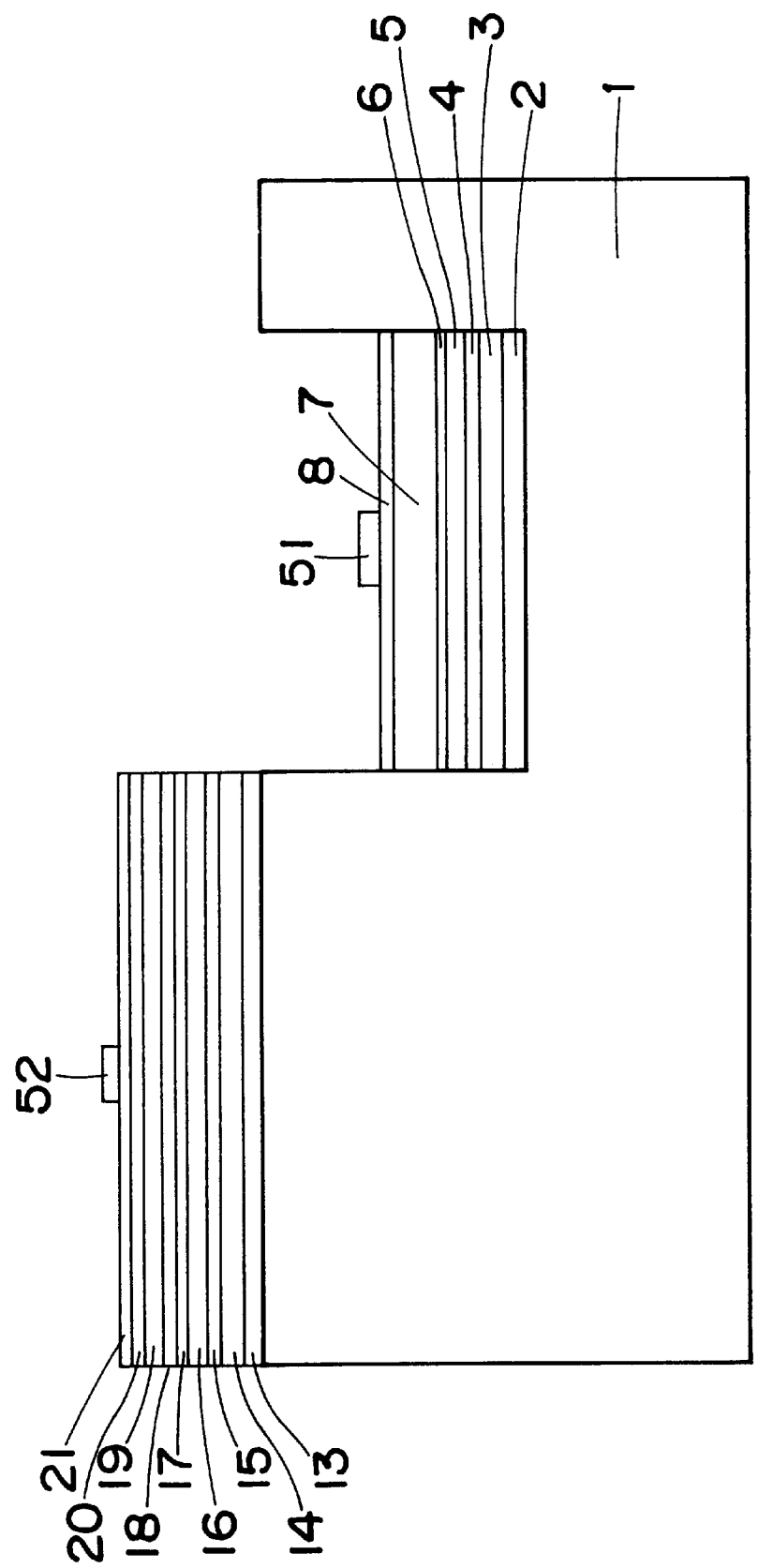
Figure 7:
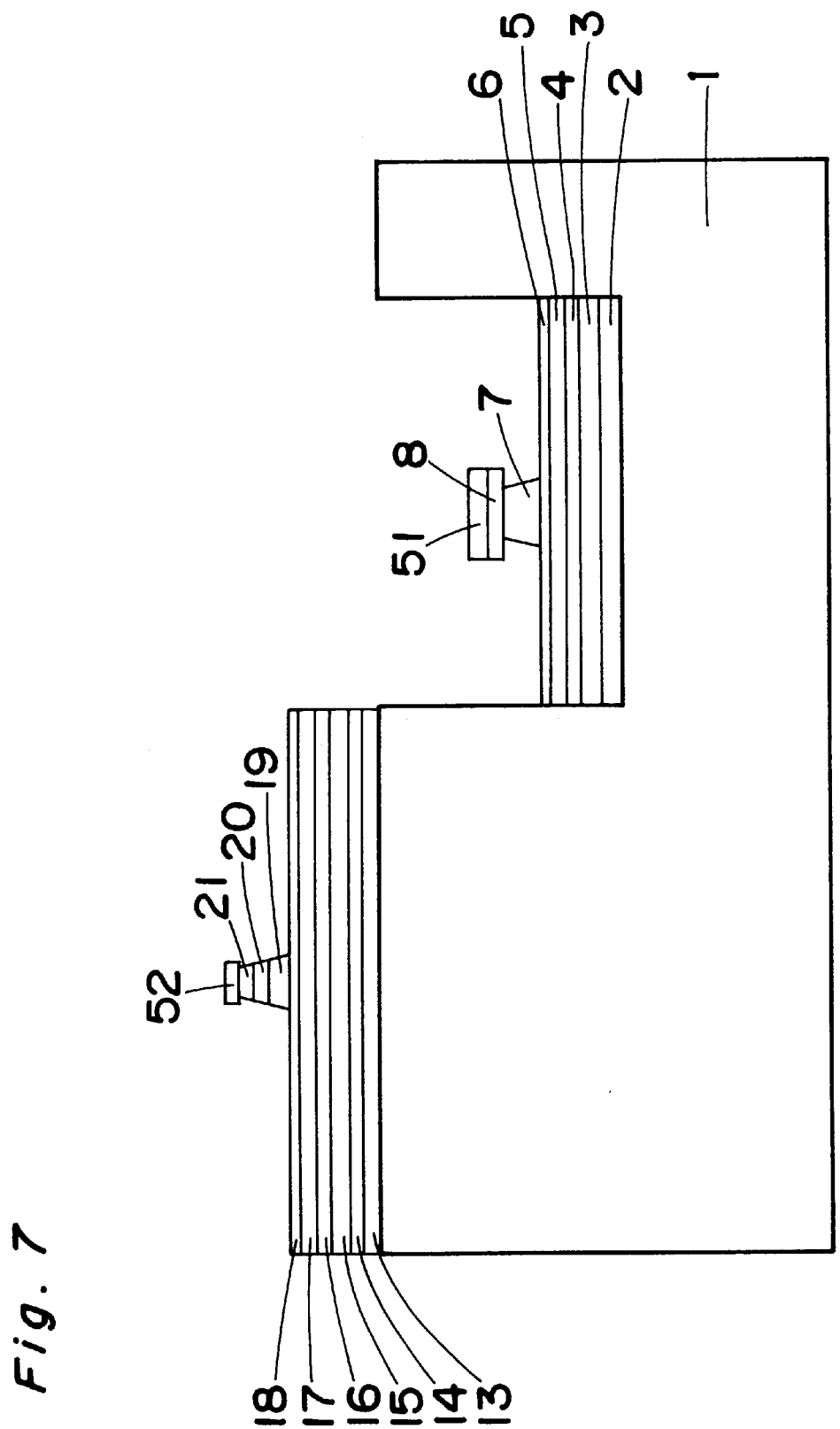

Then, a p-type $Al_{0.5}GaAs$ second cladding layer 7 and a p-type GaAs cap layer 8 of the emitting region of the infrared semiconductor laser, and a p-type $(Al_{0.72}Ga)InP$ second cladding layer 19, a p-type GaInP intermediate layer 20 and a p-type GaAs cap layer 21 of the emitting region of the red semiconductor laser are formed in a ridge shape by photolithography and etching. First, each of mask stripes 51 and 52 is formed on the p-type GaAs cap layers 8 and 21 of both emitting regions by photolithography, respectively (FIG. 6). A distance between both mask stripes of emitting regions is 100 µm, and the distance between both mask stripes of the emitting regions can be formed in the high precision by forming the mask stripes on both emitting regions simultaneously. Furthermore, after forming other mask for protecting only a mask stripe for a ridge on the red semiconductor laser element which is formed at the top portion of the step-like substrate by photolithography, etching is conducted with a mixture of sulfuric acid and hydrogen peroxide to the middle of the p-type $Al_{0.5}GaAs$ second cladding layer 7. Thereafter, etching is stopped at a p-type GaAs etching stop layer 6 with hydrofluoric acid having the selectivity for GaAs. Then, a protective mask formed on the top portion of the step-like substrate is removed, another protective mask is formed on a ridge shaped region of the infrared semiconductor laser element at the bottom portion of the step-like substrate, and the p-type GaAs cap layer 21 is etched with a mixture of sulfuric acid and hydrogen peroxide. Thereafter, etching with a mixture of bromine and phosphoric acid is conducted to the middle of the p-type GaInP intermediate layer 20 and the p-type $(Al_{0.72}Ga)InP$ second cladding layer 19, and etching is stopped at a non-doped GaInP etching stop layer 18 with phosphoric acid having the selectivity for GaInP (FIG. 7).

Figure 8:
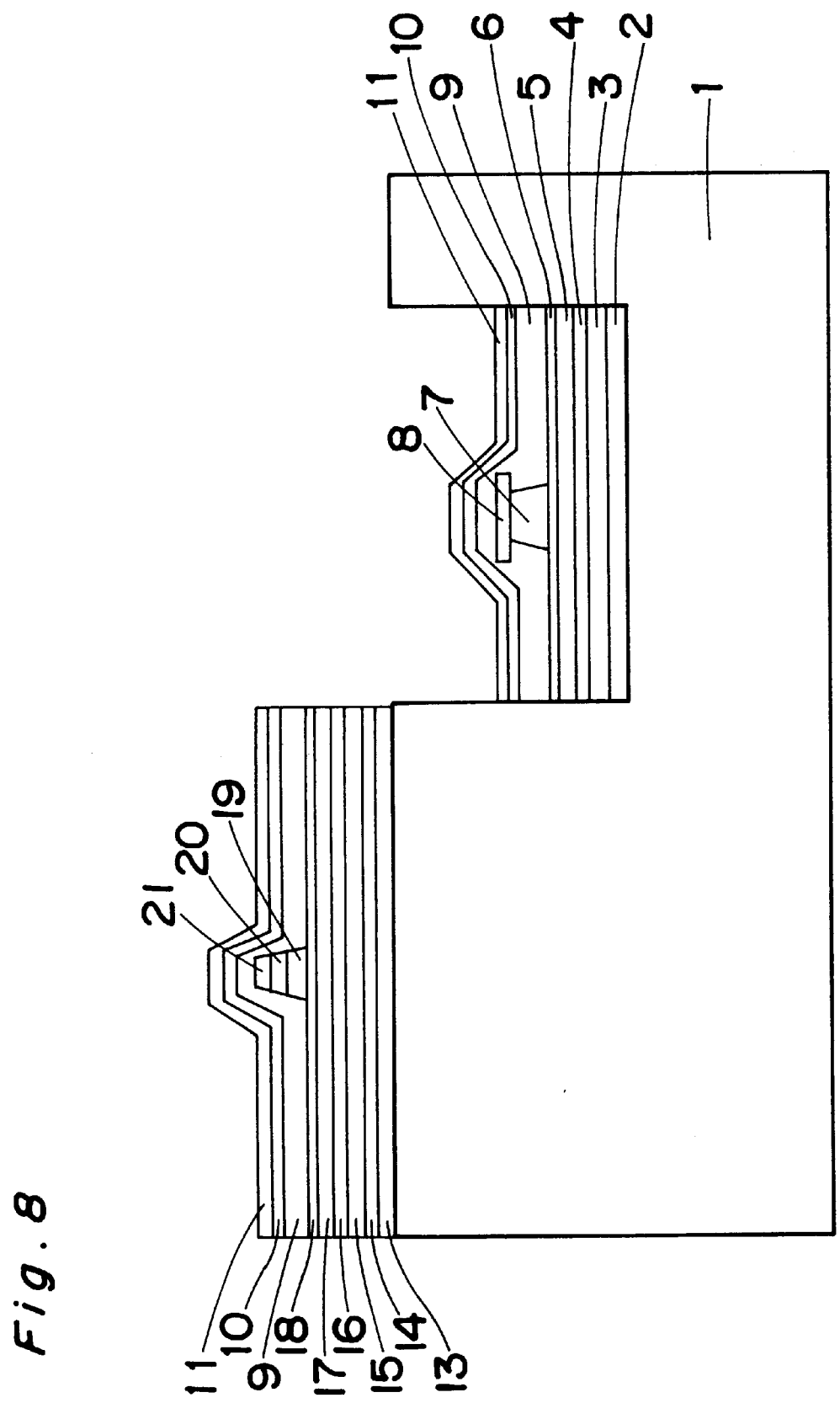

Subsequently, as shown in FIG. 8, resist masks 51 and 52 are removed, and an n-type $Al_{0.7}GaAs$ 9 having a thickness of 1.0 µm, an n-type GaAs 10 having a thickness of 0.3 µm and a p-type GaAs 11 having a thickness of 0.65 µm are grown and buried therein, at a growth temperature of 685–750° C., as a common current constriction layer of the infrared semiconductor laser and the red semiconductor laser by a second MOCVD growth.

Figure 9:
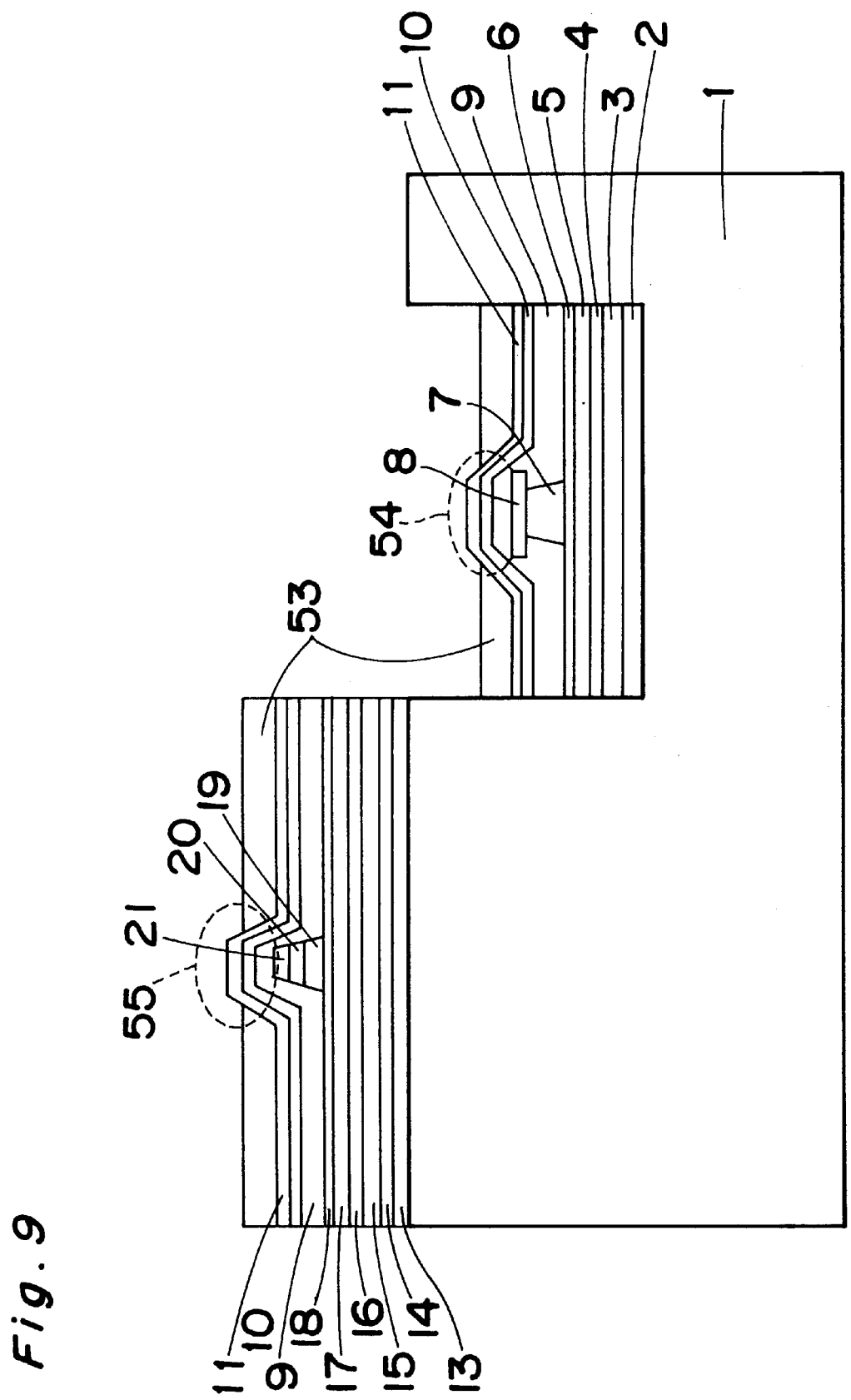

Subsequently, as shown in FIG. 9, unnecessary layers 54 and 55 exposed from an opening portion of the resist are removed using a resist mask 53 as a mask until reaching the p-type GaAs cap layers 8 and 21, respectively. In this Example, etching was conducted using a mixture of sulfuric acid and hydrogen peroxide while controlling a treatment time.

Figure 10:
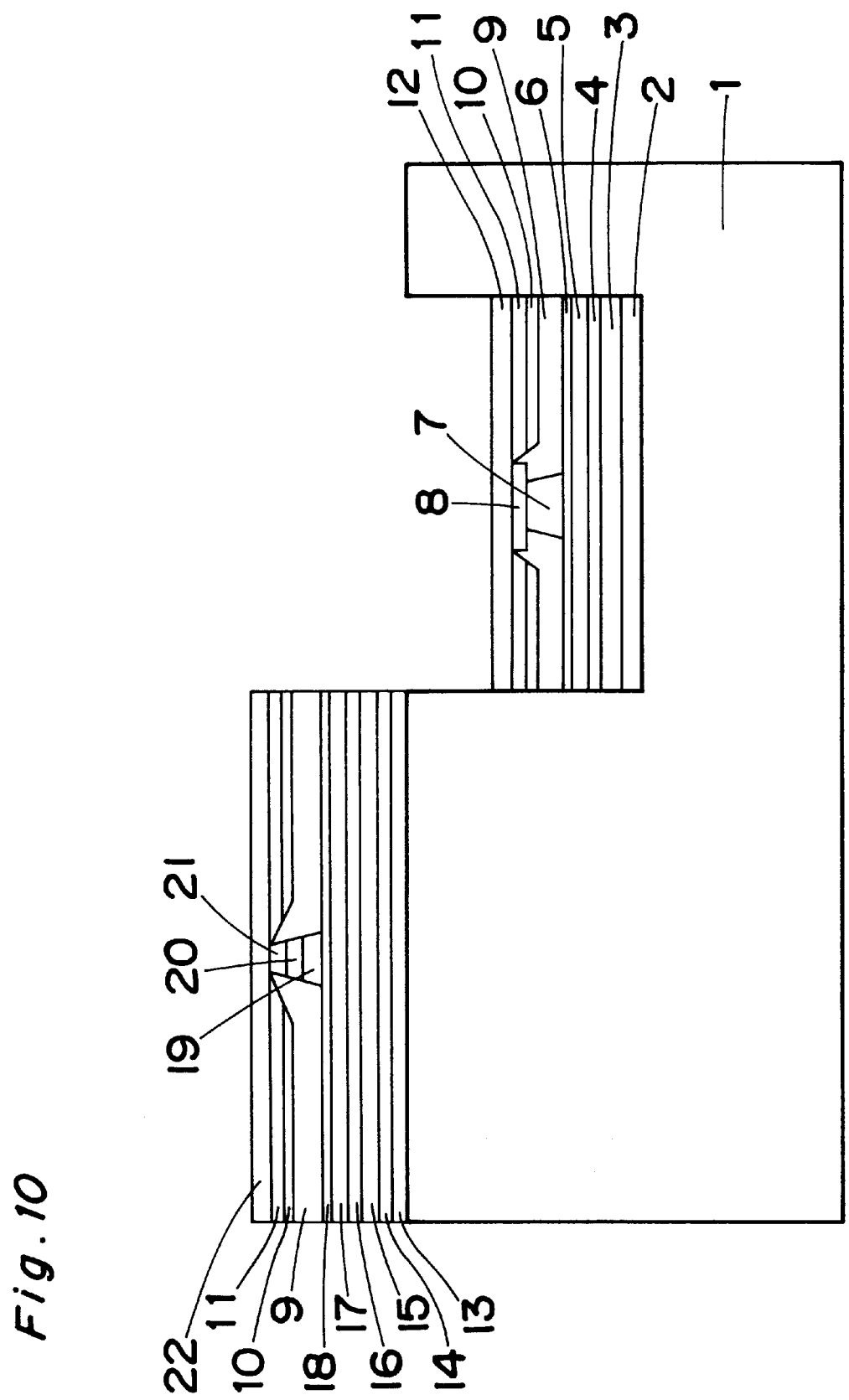

Then, as shown in FIG. 10, the resist mask 53 is removed, and the pGaAs contact layers 12 and 22 having a thickness of 5.5 $\mu$m are grown at a growth temperature of 585–700° C. by a third MOCVD growth.

Figure 11:
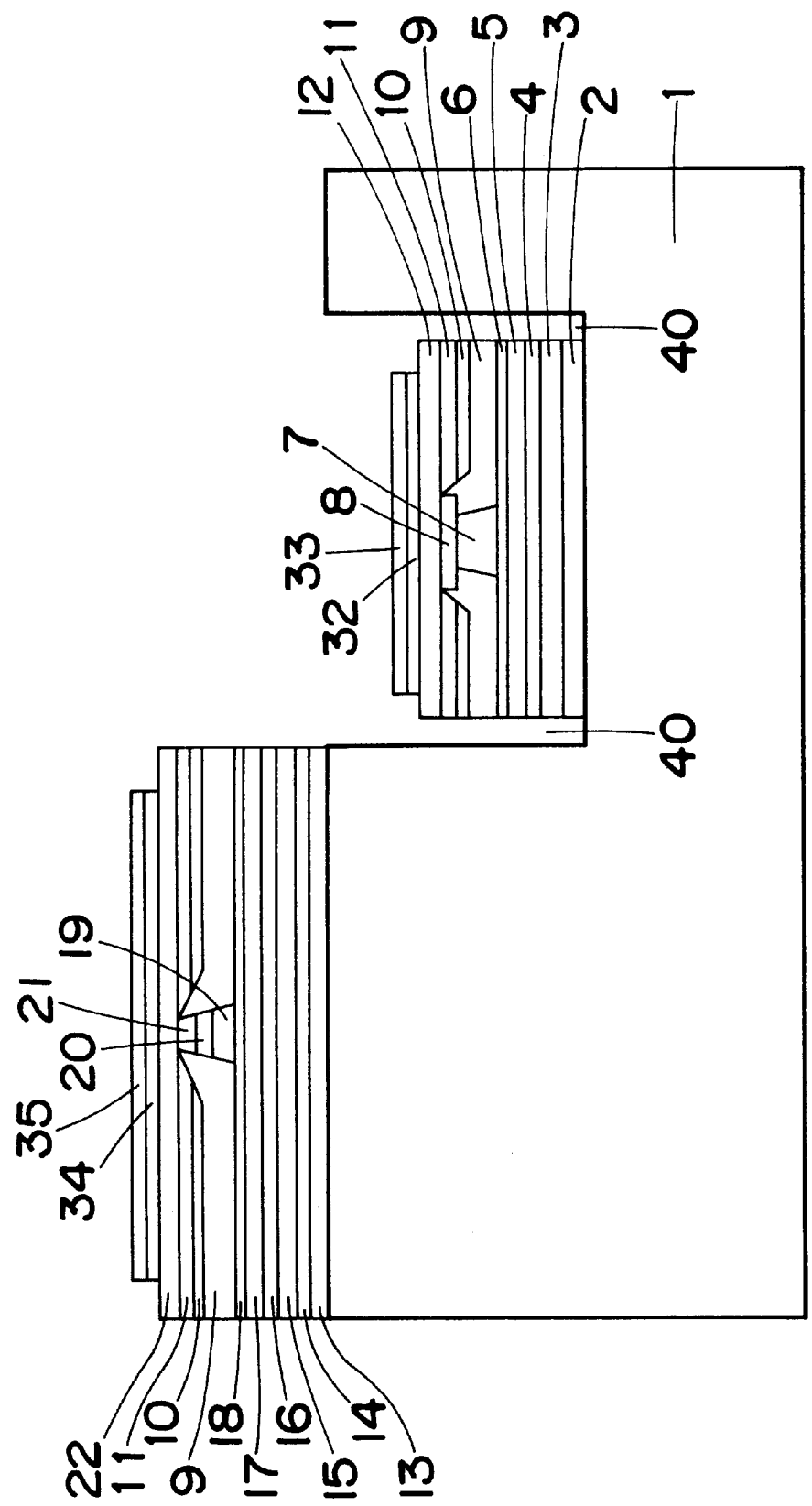

Then, as shown in FIG. 11, AuZn electrodes 32 and 34, and Mo/Au electrodes 33 and 35 are deposited on the surface side, and a pattern of p electrodes of each semiconductor laser element is fabricated by photolithography and etching. Then, after forming the $SiO_2$ film by a plasma CVD method, an opening is formed only on the side portion of the infrared semiconductor laser element formed at the bottom portion of the step-like substrate, where the infrared semiconductor laser element contacts with the substrate. Then, a groove 40 is formed by dry-etching until reaching the n-type AlGaAs cladding layer of the infrared semiconductor laser region.

Then, the n-type GaAs substrate is thinned to a predetermined thickness with a back-grinder. In this Example, the substrate was thinned so that a thickness of the n-type GaAs substrate beneath a red semiconductor laser element region, where no step is formed, becomes 100 $\mu$m. In this case, the thickness of the n-type GaAs substrate beneath the infrared semiconductor laser element region, where the step is formed, becomes 60 $\mu$m inevitably. In this manner, in the semiconductor laser element of the present invention, the substrate can be thinned from a back side thereof with a back-grinder or the like such that a thickness of the substrate at the top portion of the step-like substrate becomes 80–130 $\mu$m, preferably 90–120 $\mu$m and more preferably 90–110 $\mu$m, and the thickness of the substrate at the bottom portion of the step-like substrate becomes 20–80 $\mu$m, preferably 40–70 $\mu$m and more preferably 50–70 $\mu$m.

Finally, an AuGe/Ni electrode 30 as an n-electrode for both lasers is formed on the n-type GaAs substrate side by sputtering, and an electrode-alloying is conducted, followed by formation of an Mo/Au electrode 31 by sputtering to provide the semiconductor laser element of this Example as shown in FIG. 1.

In the case where the infrared semiconductor laser which had been formed at the bottom portion of the step-like substrate of the semiconductor laser element of this Example is driven, a driving electrical voltage is applied between the electrodes 33 and 31 to inject an electric current. In addition, in the case where the red semiconductor laser which had been formed at the top portion of the step-like substrate is driven, the driving electrical voltage is applied between the electrodes 35 and 31 to inject an electric current. In this manner, in the semiconductor laser element of this Example, the infrared semiconductor laser and the red semiconductor laser can be independently driven.

Moreover, there are a number of embodiments in the present invention and, therefore, semiconductor materials, electrode materials and the like to be used are not limited to those of the Example as described above.

Example 2

Figure 12:
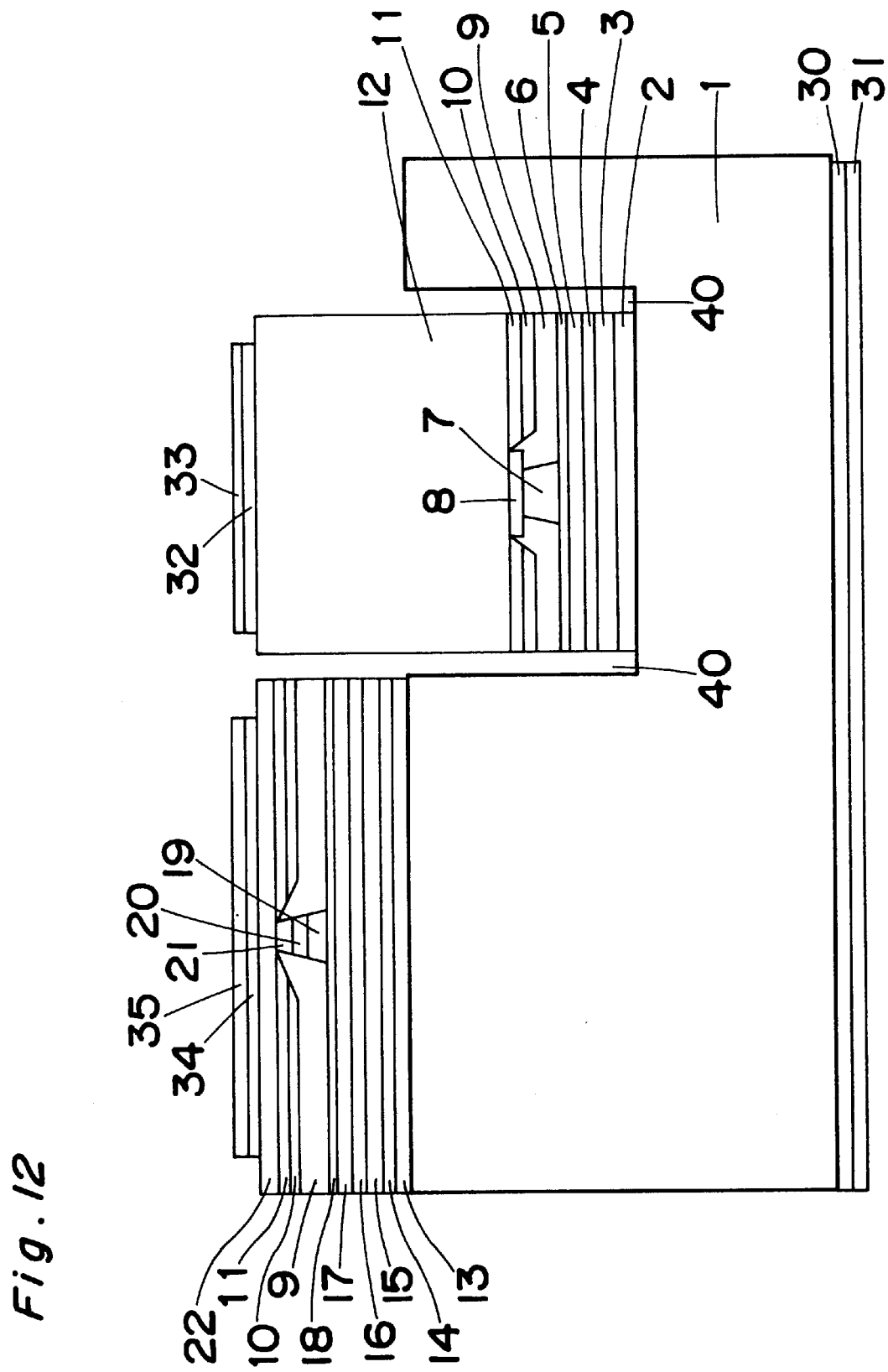
FIG. 12 is a structural view of the semiconductor laser element in accordance with Example 2 of the present invention.
Figure 13:
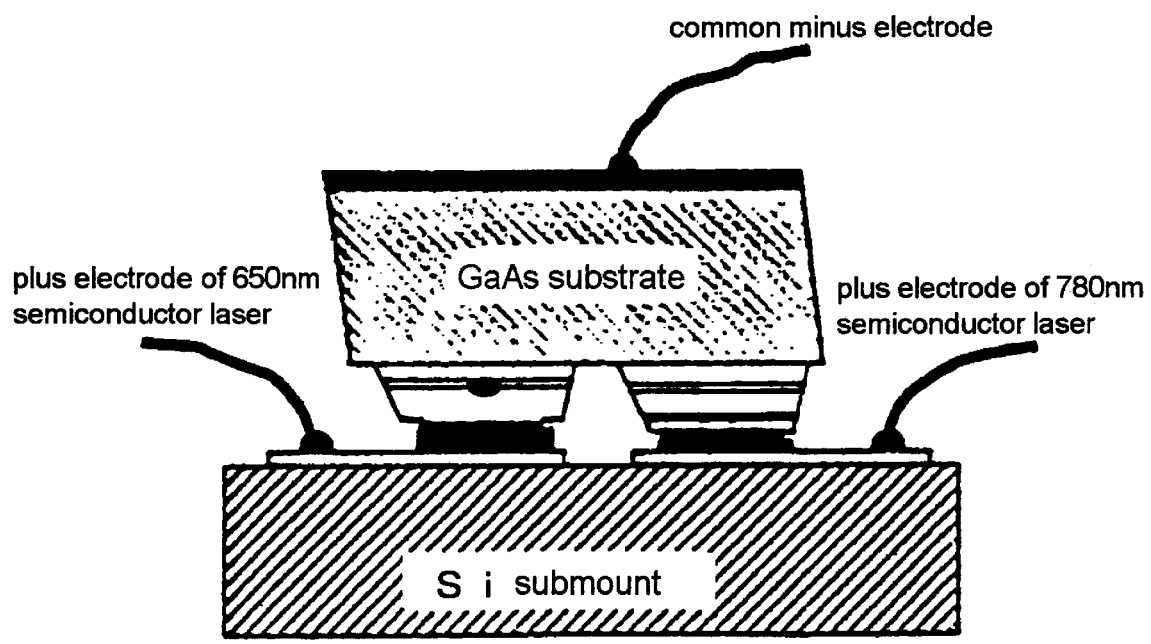
FIG. 13 is a structural view of the semiconductor laser element 1 of the prior art.
Figure 14:
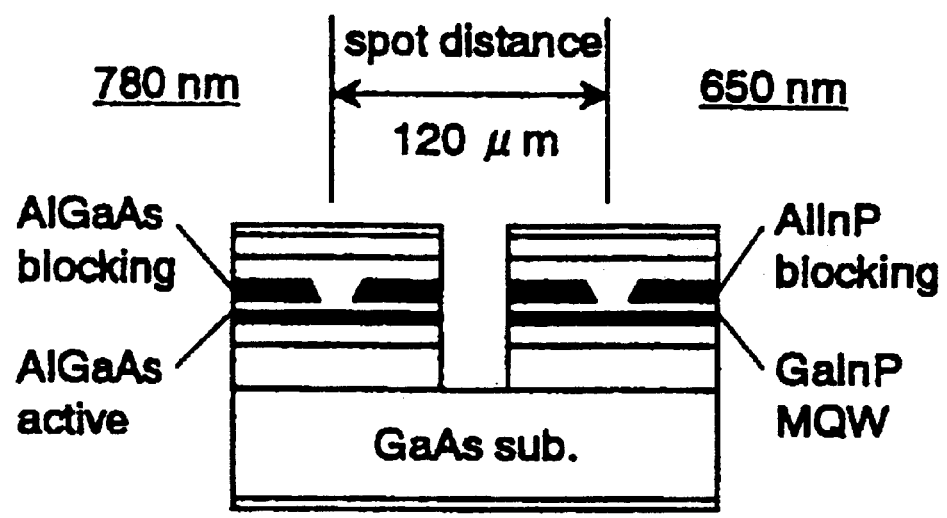
FIG. 14 is a structural view of the semiconductor laser element 2 of the prior art.

A structure of the semiconductor laser element of this Example is shown in FIG. 12. The manufacturing steps in this Example are identical to those of Example 1, but heights of the p-type GaAs cap layers of both semiconductor laser elements are made uniform by forming a thick film (40 $\mu$m) cap layer on the p-type GaAs cap layer of the infrared semiconductor laser element which is formed at the bottom portion of the step-like substrate.

In the practical step, there are only added a step in which a growth thickness of the p-type GaAs cap layer in the third MOCDV step of FIG. 10 in Example 1 is set to be 40 $\mu$m, and a step in which the thick film cap layer formed on the red semiconductor laser element at the top portion of the step-like substrate is removed using a $SiO_2$ mask by dry-etching after growing the p-type GaAs thick film cap layer.

Upon mounting the semiconductor laser element on a submount or the like, in the semiconductor laser element formed in this Example, it becomes possible to die-bond the semiconductor laser element on the submount at the p-type GaAs cap layer side since the heights of the p-type GaAs cap layers of both semiconductor laser elements are identical. Thereby, in particular, the heat-releasing property of the red semiconductor laser element can be improved, and the semiconductor laser element having the excellent temperature property and reliability can be manufactured.

Moreover, there are a number of embodiments in the present invention and, therefore, semiconductor materials, electrode materials and the like to be used are not limited to those of the Example as described above.

The present invention relates to a semiconductor laser element in which a plurality of emitting regions, each having different wavelength, are formed on one substrate and, thereby, it becomes possible that the tracking error in one semiconductor laser due to the returning light of three beams is prevented while the semiconductor laser element is stably manufactured without split of a wafer in a wafering step.

What is claimed is:

1. A semiconductor laser element, which comprises a plurality of emitting regions formed on one substrate, each region having different wavelength, wherein both side portions of at least one emitting region are opposed to a part of the substrate.

2. The semiconductor laser element according to claim 1, wherein the side portion of at least one emitting region is separated from a part of the substrate.

3. The semiconductor laser element according to claim 1, which further comprises a thick film cap layer grown above the emitting region in which at least one side portion is opposed to a part of the substrate.

4. The semiconductor laser element according to claim 1, wherein the substrate is an n-type GaAs substrate having a plane orientation as an off angle from the (100) surface direction toward the <011> direction in a range of 5–25°.

5. A process for manufacturing a semiconductor laser element, comprising:

forming a first emitting region at a bottom portion of a step-like substrate;

forming a second emitting region at a top portion of the step-like substrate; and thinning the substrate such that the thickness from the first emitting region to a bottom surface of the substrate becomes 70 $\mu$m or smaller and the thickness from the second emitting region to the bottom surface of the substrate becomes 90 $\mu$m or larger.

6. An optical pickup, which comprises the semiconductor laser element according to claim 1, wherein a thickness from the emitting portion, the side portion of which is opposed to a part of the substrate, to the bottom surface of the substrate is a thickness such that the returning light of side beams does not enter thereinto.

* * * * *